(12) United States Patent
Pobanz et al.

(10) Patent No.: US 6,548,840 B1
(45) Date of Patent: Apr. 15, 2003

(54) MONOLITHIC TEMPERATURE COMPENSATION SCHEME FOR FIELD EFFECT TRANSISTOR INTEGRATED CIRCUITS

(75) Inventors: Carl W. Pobanz, Topanga, CA (US); Mehran M. Matloubian, Encino, CA (US)

(73) Assignee: HRL Laboratories, LLC, Malibu, CA (US)

( * ) Notice: Subject to any disclaimer, the term of this patent is extended or adjusted under 35 U.S.C. 154(b) by 0 days.

(21) Appl. No.: 09/542,241

(22) Filed: Apr. 3, 2000

(51) Int. Cl.$^7$ .......................... H01L 27/14; H01L 27/02
(52) U.S. Cl. .................. 257/252; 257/379; 257/469
(58) Field of Search .................. 257/252, 379, 257/469

(56) References Cited

U.S. PATENT DOCUMENTS

| | | | |
|---|---|---|---|
| 3,715,638 A | * 2/1973 | Polye | 361/274.1 |
| 4,053,915 A | * 10/1977 | Cave | 257/271 |
| 4,229,753 A | * 10/1980 | Bergeron et al. | 257/469 |
| 5,138,414 A | * 8/1992 | Shinohara | 257/417 |
| 5,373,250 A | 12/1994 | Gatti et al. | |
| 5,387,880 A | 2/1995 | Kobayashi | |
| 5,724,004 A | 3/1998 | Reif et al. | |
| 6,081,014 A | * 6/2000 | Redford et al. | 257/359 |

FOREIGN PATENT DOCUMENTS

JP    10-65107 A   *  3/1998

OTHER PUBLICATIONS

Kobayashi et al., "Monolithic Regulated Self–Biased HEMT MMICs",IEEE Trans. Microwave Theory Tech., pp. 2610–2616, Dec. 1994.

Dow et al., "Monolithic Receivers with Integrated Temperature Compensation Function", 1991 IEEE GaAs IC Symposium Digest, pp. 267–270, 1991.

* cited by examiner

Primary Examiner—Allan R. Wilson
(74) Attorney, Agent, or Firm—Tope-McKay & Associates

(57) ABSTRACT

A method and apparatus for substantially canceling the effects of temperature on the electrical performance of Field Effect Transistor (FET) integrated circuits (IC's) by exploiting a subtle feature of an epitaxial resistor implemented in an FET process. Specifically, the invention takes advantage of two constituent epitaxial resistor components having resistances that vary monotonically in opposite directions as functions of temperature. The invention includes a method for selecting the geometry of such an epitaxial resistor to give it either temperature invariance or a specific, useful functional temperature dependence.

17 Claims, 5 Drawing Sheets

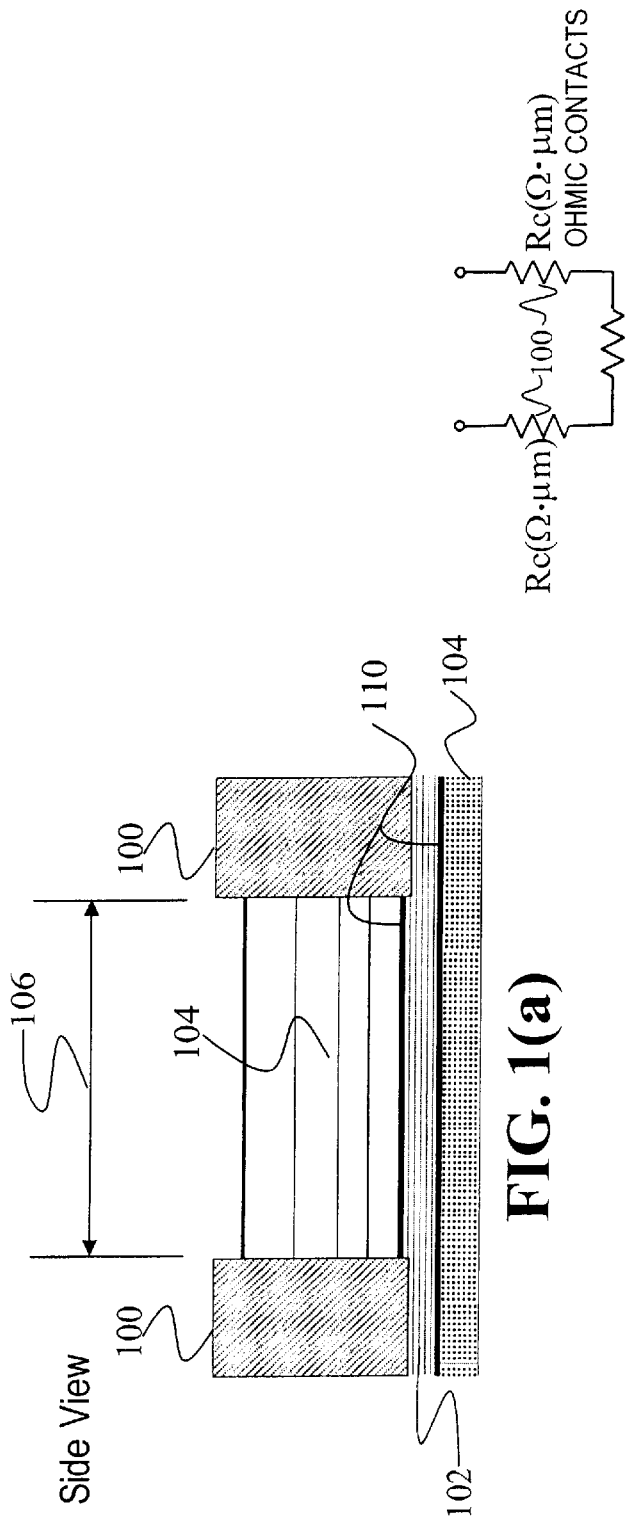
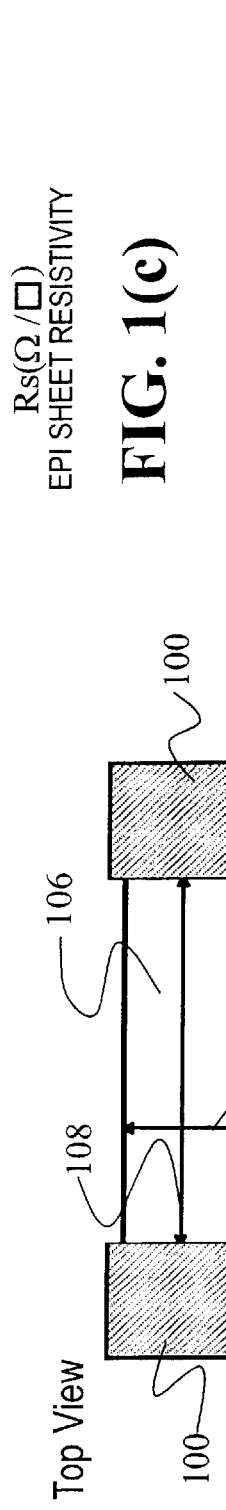
FIG. 1(a)
FIG. 1(b)
FIG. 1(c)

MONOLITHIC TEMPERATURE COMPENSATION SCHEME FOR FIELD EFFECT TRANSISTOR INTEGRATED CIRCUITS

TECHNICAL FIELD

This invention relates to a method and apparatus for minimizing the effects of temperature on integrated circuit performance. More specifically, the invention provides a means for minimizing the effects of temperature on the electrical performance of field effect transistor NET) integrated circuits (ICs).

BACKGROUND OF THE INVENTION

Field effect transistors (FETs) and more specifically high electron mobility transistor (HEMT) integrated circuits have widespread application in many areas including aerospace and mobile communication systems. When FET or HEMT integrated circuits are exposed to variations in temperature, their electrical performance characteristics can vary. Many applications for such circuits require consistent operation over a broad range of temperatures. To achieve temperature-invariant operation of FET or HEMT ICs, numerous temperature compensation (TC) solutions have evolved, with varying degrees of success. The existing solutions can be classified into three general approaches.

The first approach involves the use of external temperature sensors and direct-current amplifiers to generate a control signal that is delivered to the integrated circuit. Common candidates for this solution are Microwave Monolithic Integrated Circuits (MMICs). This is perhaps the most obvious temperature compensation method, and has been in use for decades. Embodiments of the idea, as applied to high frequency field-effect transistor (FET) amplifiers, can be found in U.S. Pat. No. 5,373,250 (Gatti et al., 1994) and U.S. Pat. No. 5,724,004 (Reif et al., 1998). The main disadvantage of this method is that external circuits must be added for the temperature compensation function. These external circuits require temperature-variable elements such as thermistors that are not easily integrated on-chip. Additionally, the thermal sensor elements must be located in close proximity to the MMIC in order to accurately provide a meaningful temperature reading. This proximity requirement further complicates the assembly of the temperature-compensated circuit embodying this solution.

The second approach commonly employed utilizes an on-chip temperature sensor, such as a diode, in conjunction with an external feedback control loop. This is a variation of the first approach, where the temperature-sensing element has been integrated into the MMIC chip. The sensor is typically a monolithic diode that is biased by a constant current from an external source to produce a terminal voltage inversely proportional to temperature. This voltage is amplified and used either to control the bias of active devices on the IC or to control a variable attenuator to adjust the response of the circuit as it changes with ambient temperature (c.f., Long, et al., "Wideband HEMT MMIC Low-noise Amplifier with Temperature Compensation," *Electronics Letters*, Mar. 3, 1994, pp. 422–423; also Dow, et al., "Monolithic Receivers with Integrated Temperature Compensation Function," 1991 *IEEE GaAs IC Symposium Digest*, pp. 267–270). The disadvantages of this method include the size, the cost, and the assembly complications arising from the addition of external control circuits, which typically require individual adjustment to match the temperature characteristics of each MMIC.

The third approach utilizes an on-chip direct-current feedback amplifier to regulate the bias of the active radio frequency (RF) circuits. In this approach, a direct-current amplifier is integrated into the MMIC in order to regulate the bias current applied to the active RF devices (Kobayashi, et al, "Monolithic Regulated Self-biased HEMT MMICs" *IEEE Trans. Microwave Theory Tech.*, December 1994, pp. 2610–2616; also U.S. Pat. No. 5,387,880). While this monolithic solution is the most compact scheme in the literature, it has disadvantages when applied to high-performance HEMT MMICs with low direct-current power dissipation, such as are required in satellite communications circuitry. Integrating the active bias regulator on-chip involves designing precise direct-current operational-amplifiers into a semiconductor process optimized for high-frequency RF devices. Such devices are not well suited for these types of precise direct-current operational-amplifiers. This compromise results in an inefficient regulator, which may more than double the power consumption of the IC.

SUMMARY OF THE INVENTION

The present invention provides both methods and circuits that are simpler, more robust, more compact and significantly more power-efficient than previous, comparable circuits.

One embodiment of the present invention includes an apparatus comprising a temperature compensating epitaxial resistor having a first resistive component and a second resistive component, wherein the first resistive component includes an electrically isolated semi-conducting channel wherein the channel has a width and a length. The electrical resistance of the semiconductor is functionally dependent on the channel geometry. The second resistive component is comprised of a plurality of ohmic contacts. The ohmic contacts are made of a substantially conducting material such as a heavily doped semiconductor or a transition metal. The ohmic contacts are functionally interfaced with the first resistive component, and the ohmic contacts have electrical resistance that is functionally dependent on temperature and geometry. The first and second resistive components have opposite, and independently adjustable, functional temperature dependences.

Another embodiment of the present invention comprises a temperature compensated field effect transistor wherein the transistor includes, an epitaxial resistor having a first resistive component and a second resistive component, wherein the first resistive component includes an electrically isolated semi-conducting channel wherein said channel has a width and a length. The electrical resistance of the semiconductor is functionally dependent on the channel geometry. The second resistive component is comprised of a plurality of ohmic contacts, wherein the ohmic contacts are functionally interfaced with the first resistive component, and wherein the ohmic contacts have electrical resistance that is functionally dependent on temperature and geometry. The first and second resistive components have opposite, and independently adjustable, functional temperature dependences.

Yet another embodiment of the present invention relates to a method for controlling or substantially eliminating temperature induced performance variations in field effect transistor circuits wherein the method includes integrating a thermally compensating resistor into the field effect transistor circuits, wherein the resistor compensates for temperature induced performance variations by responding to, and compensating for, temperature induced performance variations.

In yet another embodiment the present invention uses an epitaxial resistor to control temperature induced performance variations wherein the epitaxial resistor having a first resistive component and a second resistive component, wherein the first resistive component includes an electrically isolated semi-conducting channel wherein the channel has a width and a length. The electrical resistance of the semiconductor is functionally dependent on the channel geometry. The second resistive component is comprised of a plurality of ohmic contacts, wherein the ohmic contacts are functionally interfaced with the first resistive component, and wherein the ohmic contacts have electrical resistance that is functionally dependent on temperature and geometry. The first and second resistive components have opposite, and independently adjustable, functional temperature dependences.

Yet another embodiment of the present invention includes an apparatus for locally measuring temperature within a circuit, where the apparatus includes at least one reference resistor and at least one temperature-indicating resistor. The reference resistor or resistors have a specified temperature dependence, and the temperature indicating resistor or resistors ideally have a substantially constant temperature functionality. The electrical properties of the different resistors are compared, and provide a temperature signal. One example of such a comparative system would include a Wheatstone bridge, where two temperature independent resistors and two temperature dependant resistors having opposite temperature dependences are used.

BRIEF DESCRIPTION OF THE DRAWINGS

The objects, features, and advantages of the present invention will be apparent from the following detailed description of the preferred embodiment of the invention with references to the following drawings.

FIG. 1 Shows an epitaxial resistor in a FET or HEMT apparatus, and its equivalent dc circuit schematic;

DESCRIPTION OF THE PREFERRED EMBODIMENTS

Figure 2:
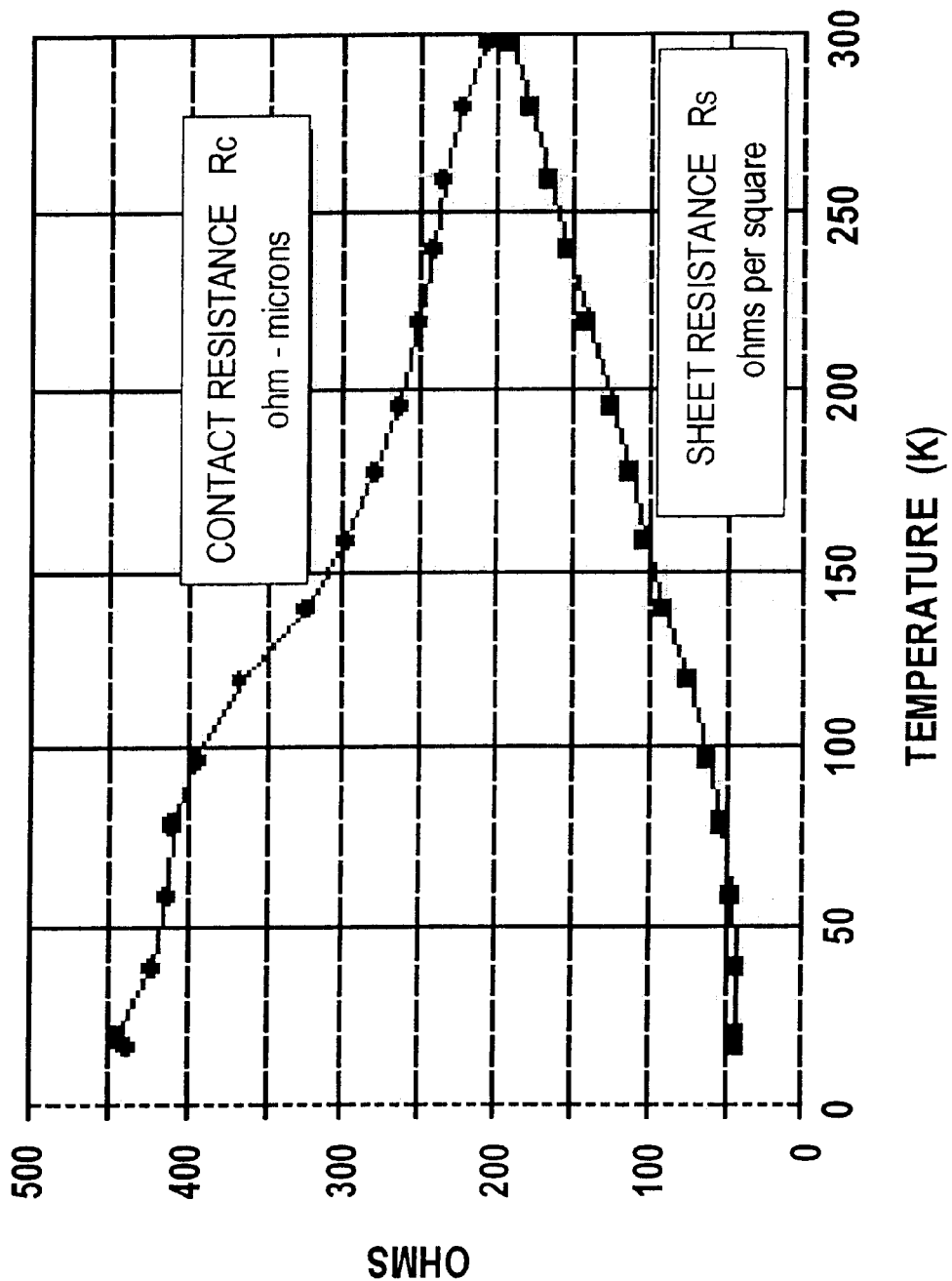
FIG. 2 shows the temperature dependence of epitaxial resistor components. Specifically, in this case, an Indium Phosphide HEMT device.

The present invention provides a method and an apparatus useful for controlling and monitoring the effects of temperature on the electrical performance of field effect transistors (FET) integrated circuits (ICs), and may be tailored to a variety of other applications. The following description is presented to enable one of ordinary skill in the art to make and use the invention and to incorporate it in the context of particular applications. Various modifications, as well as a variety of uses in different applications, will be readily apparent to those skilled in the art, and the general principles defined herein may be applied to a wide range of embodiments. Thus, the present invention is not intended to be limited to the embodiments presented, but is to be accorded the widest scope consistent with the principles and novel features disclosed herein.

Microwave and millimeter-wave systems for communications, radar, and imaging often require monolithic IC amplifiers with high gain that must be precisely controlled regardless of changes in the physical environment. Existing physical environment control systems often waste power, increase system complexity and assembly costs, and may make some applications prohibitively expensive. By contrast, the temperature compensation method and apparatus according to the present invention use components that are already present on most FET or HEMT ICs. Since the invention is contained within the circuit, the circuit does not require external controls. The invention's simplicity is desirable from both a cost and design perspective.

The method and apparatus of the present invention are applicable to any integrated circuit using FET devices, including Indium Phosphide (InP) and Gallium Arsenide (GaAs)-based HEMT Microwave Monolithic Integrated Circuits. The method and apparatus are especially well suited to aerospace and mobile/outdoor applications, particularly applications in the microwave and millimeter wave regions of the electromagnetic spectrum. These include low noise amplifiers (LNAs) for satellite constellations, millimeter-wave radar and imaging applications for aerospace, including environmental remote sensing, zero-visibility aircraft landing, and automotive collision avoidance applications. The cost savings in reduced chip count and simplified assembly make this technology especially desirable where a combination of low cost and high performance is required. For example, on-chip temperature compensation allows large electronic gains to be safely obtained in a single IC, whereas two or more uncompensated ICs may have previously been required in order to provide variable attenuation between amplifier stages to "level out" the gain as the temperature changes.

One embodiment of the present invention relates to an apparatus and method for minimizing the effects of temperature on the electrical performance of field effect transistor (FET) integrated circuits (ICs). The apparatus and method exploit an inherent feature of an epitaxial resistor optionally implemented in a HEMT integrated circuit during the fabrication process. Specifically, the epitaxial resistor according to the present invention will have two constituent components wherein the material properties of the constituent components have resistances that vary independently and nearly monotonically in opposite directions, as functions of temperature. One embodiment of the invention provides a method for selecting the geometry of such an epitaxial resistor to provide either temperature invariance or a specific, functionally useful, temperature dependence. One anticipated application of this embodiment is its use as a means for compensating for temperature artifacts common in many FET devices. In such an application, the embodiment may be used to stabilize the performance of active circuits in variable temperature environments. A non-limiting example of such a circuit is a high gain amplifier. The invention also has application as an aid in circuit design and diagnosis. By comparing the resistance of a compensated resistor with the resistance of an uncompensated resistor, it is possible to determine localized regions of thermal inhomogeneities. This embodiment of the invention is helpful in monitoring a circuit's ability to effectively sink excessive heat, or to warn electronic systems or system operators that a circuit is overheating. The invention could also be used to augment thermal images of integrated circuitry to help designers identify large current-draw areas on integrated circuits and is useful in diagnosing problems with circuit designs.

A side-view of the physical structure of an epitaxial resistor according to the present invention is illustrated in FIG. 1a. The essential components include: a plurality of ohmic contacts 100, and an isolated semi-conductor channel 102 residing in a layered semiconductor. A plurality of layer elements 104 are optionally placed above and below the semi-conductor channel 102 as may be found in a HEMT. The first and second ohmic contacts 100 can be alloyed into the semiconductor as a means for making electrical contact with the isolated semi-conductor channel 102. The conducting channel 102 is bounded by the first and second ohmic contacts 100 and an isolation area 106, outside of which the layered semiconductor 104 is essentially non-conductive. The resulting structure is essentially an FET without a gate terminal; wherein said FET exhibits a linear resistance at voltages below a process-dependent saturation voltage, and is widely used as a resistor in integrated circuits due to its convenience and ease of fabrication. A top view of the functional components of FIG. 1a is shown in FIG. 1b, the conductive channel 102 has a length, L, 108 and a width, W, 110. It should be understood that length refers to the direction parallel to current flow and width refers to the direction perpendicular to the current flow, thus, as a non-limiting example, a non-rectangular conductive channel 102, and two or more ohmic contacts is anticipated as a configuration. The attached drawings represent only one embodiment of the present invention and are simplified to aid those skilled in the art in understanding the concepts embodied in the present invention and are not intended, in any way, to limit the scope of the invention. The equivalent circuit diagram, shown in FIG. 1c, shows that the resistance of the epitaxial resistor R of the invention is comprised of an aggregate of resistances. This aggregate arises from the first and second ohmic contacts 100, and the isolated conducting channel 102. The resistance R of the epitaxial resistor is determined by the sheet resistance Rs of the isolated conducting channel 102 in ohms per square, and the specific resistance Rc of the first and second ohmic contacts 100. The ohmic contacts are substantially identical, in terms of both electrical and physical properties and, consequently only one constant Rc is needed. The units for both ohmic contacts are ohm-microns:

$$R = Rs\frac{L}{W} + 2\frac{Rc}{W}, \quad (1)$$

where

L is the conductive channel length 112; and,

W is the conductive channel width 114.

The sheet and contact-resistive components arise from different mechanisms in the epitaxial structure, and as a result behave differently when subjected to changes in temperature. The ohmic contact resistance resulting from conduction across the semiconductor-metal interface decreases with temperature, while the epitaxial sheet resistance increases with temperature. This effect is observed experimentally as shown in FIG. 2, which plots the temperature dependence of epitaxial resistor components versus temperature for an HEMT-process epitaxial resistor. The temperature-dependence of the resistive components causes the epitaxial resistor's value to vary with temperature as:

$$\frac{\partial R}{\partial T} = \frac{1}{W}\left(L\frac{\partial Rs}{\partial T} + 2\frac{\partial Rc}{\partial T}\right) \quad (2)$$

From equation 2, it may be seen that by varying the resistor's geometry, L 108 and W 110, the resistive temperature dependence can be controlled. For example, a desired temperature compensation slope $\partial R/\partial T$ could be obtained by using an epitaxial resistor with conductive channel length 102 denoted $L_{TC}$ and given by:

$$L_{TC} = \frac{W\frac{\partial R}{\partial T} - 2\frac{\partial Rc}{\partial T}}{\frac{\partial Rs}{\partial T}} \quad (3)$$

where the width W sets the desired resistance R at a baseline temperature T. The ohmic contacts 100 and isolated conductive channel 102 temperature coefficients depend on the semiconductor process and are determined empirically.

Another embodiment of the present invention comprises a conductive channel 102 having a resistance R and a length L 108. If the combination of the conductive channel 102 resistance and the ohmic contacts' 100 resistances are held substantially invariant over a wide range of temperatures, the conductive channel 102 length is said to be $L_{0TC}$. In such situations the device has a fixed resistance value over a wide range of temperatures, i.e.

$$\frac{\partial R}{\partial T} = 0.$$

This occurs in resistors with length:

$$L_{0TC} = -2\frac{\partial Rc/\partial T}{\partial Rs/\partial T}. \quad (4)$$

For a resistive element to be physically realizable, the temperature coefficients $$\frac{\partial Rs}{\partial T}$$

and $$\frac{\partial Rc}{\partial T}$$

must have opposite signs. In the embodiment shown in FIG. 2, an Indium Phosphide HEMT epitaxial resistor is measured. For this embodiment, the resistance temperature coefficients were determined to be $$\frac{\partial Rs}{\partial T} = 0.56 \text{ }\Omega/\text{C}. \quad \text{and} \quad \frac{\partial Rc}{\partial T} = -0.84 \text{ }\Omega\cdot\mu\text{m}/°\text{ C}.$$

with these values being fairly constant over a wide range of temperatures, wherein the range is centered at room temperature. Both positive and negative temperature-compensating functions can be obtained with different resistor geometries, as shown in FIGS. 3 and 4.

Figure 3:
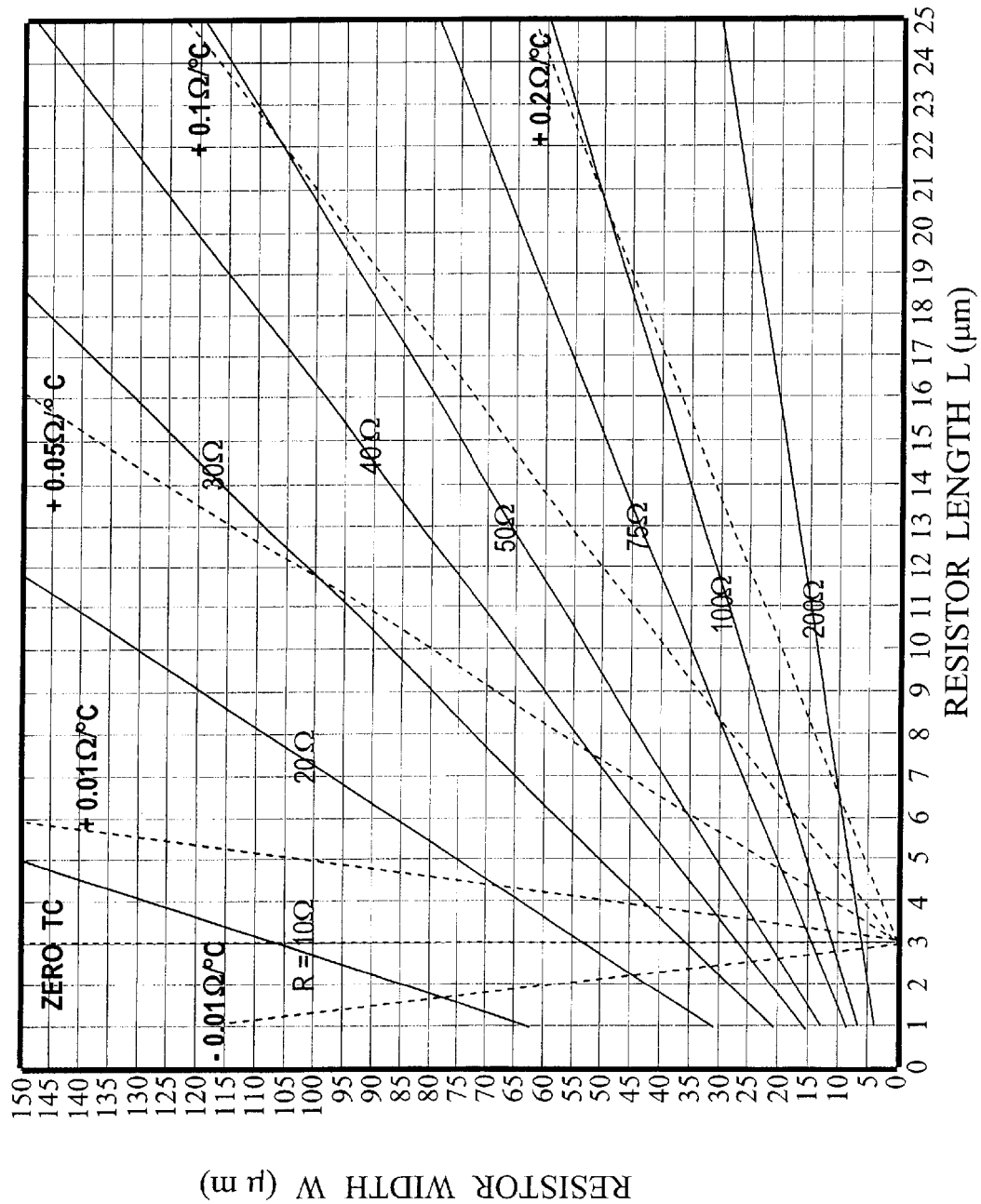
FIG. 3 graphically depicts the contours of resistance, indicated by a solid line, and contours of temperature coefficients, indicated by a dashed line, versus geometry for an epitaxial resistor. The experimental results depicted pertain to a resistive element having an sheet resistance, $R_s$,= 220 $\Omega$/square, and a contact resistance, $R_c$,=200 $\Omega\mu m$.

The contours of resistance and temperature coefficients versus geometry of an epitaxial resistor are shown in the graph of FIG. 3. The solid lines in the graph represent the contours of resistance, and the dashed lines represent the temperature coefficients. The total resistance R of the epitaxial resistor is determined by the sheet resistance Rs of the channel in ohms per square, and the specific resistance Rc of the two ohmic contacts in ohm-microns. For the data obtained in FIG. 3, Rs=220 Ω/square, and Rc=200 Ω-μm.

Figure 4:
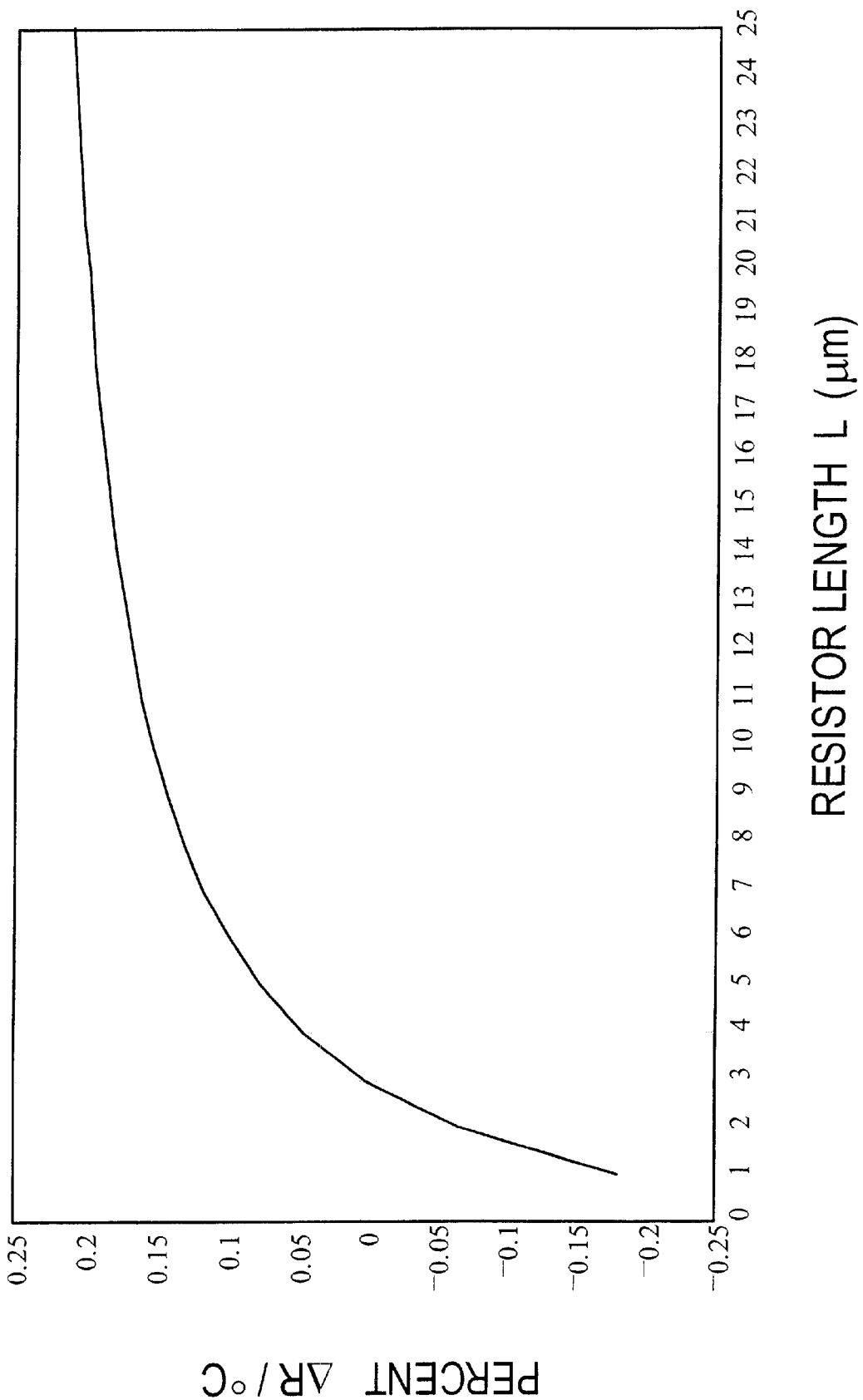
FIG. 4 illustrates the percent of resistance change per unit of temperature as a function of epitaxial resistor length.

FIG. 4 shows the percent resistance change with temperature as a function of epitaxial resistor length. The temperature-sensitive resistor may be used to compensate for the temperature dependence of an active FET or HEMT circuit, such as the basic common-source amplifier stage shown in FIG. 5a and FIG. 5b. For a fixed drain voltage V+, the gain of the amplifier depends on bias current $I_{ds}$, which is set by the gate-source voltage $V_{gs}$ relative to the threshold voltage $V_T$. For moderate $I_{ds}$, $$I_{ds} = \beta(V_{gs} - V_T)^2, \quad (5)$$

The value of α depends on the FET material and gate periphery.

As the device temperature changes, the bias current $I_{ds}$ changes primarily as a result of a shift in the threshold voltage $V_T$, with a secondary effect due to β variation. For a typical FET device, the threshold voltage $V_T$ is about −0.5V and the $\partial V_T/\partial T$ shift is in the range of −0.1 to −1.0 mV/° C. The temperature-compensation circuit must adjust the gate-source voltage $V_{gs}$ to compensate for the threshold voltage shift and thus keep the bias current $I_{ds}$ constant.

The gain of the device is proportional to the extrinsic transconductance $g_m$, which is defined as:

$$g_m \equiv \frac{\partial I_{ds}}{\partial V_{gs}} = 2\beta(V_{gs} - V_T), \quad (6)$$

so, for a particular bias point, $$I_{ds} = \frac{g_m}{2}(V_{gs} - V_T). \quad (7)$$

The simplest bias scheme uses a fixed gate-source voltage $V_{gs}$ to set the bias current $I_{ds}$. Since the threshold voltage $V_T$ is negative, both positive voltage drain-source, $V_{ds}$, and negative gate-source voltage $V_{gs}$ bias voltages are required, which is often inconvenient. Also, the bias current, $I_{ds}$, is not very stable with temperature change, due to threshold voltage variation, since $$\frac{\partial I_{ds}}{\partial T} = \frac{\partial I_{ds}}{\partial V_T}\frac{\partial V_T}{\partial T} \quad (8)$$

$$= -2\beta(V_{gs} - V_T)\frac{\partial V_T}{\partial T} \quad \text{(fixed gate-source voltage } V_{gs} \text{ bias)}$$

$$= -g_m \frac{\partial V_T}{\partial T}.$$

Thus, higher gain results in greater temperature sensitivity. An improved bias scheme is the self-bias circuit shown in FIG. 5a, where a resistor 500, is added to the source terminal and is RF-bypassed by a capacitor 502. The resistor R(T) 500 generates the bias voltage $V_{gs} = -I_{ds}R(T)$ for the desired drain current $I_{ds}$ 504 given the correct resistive value of R(T) 500. This scheme eliminates the need for a negative bias voltage supply and reduces the sensitivity of the bias point to temperature by a factor $(1+g_m R)^{-1}$ due to negative feedback, $$\frac{\partial I_{ds}}{\partial T} = \frac{\partial I_{ds}}{\partial V_T}\frac{\partial V_T}{\partial T} \quad (9)$$

$$= \frac{-g_m}{1+g_m R}\frac{\partial V_T}{\partial T} \quad \text{(self-bias)}$$

Figure 5B:
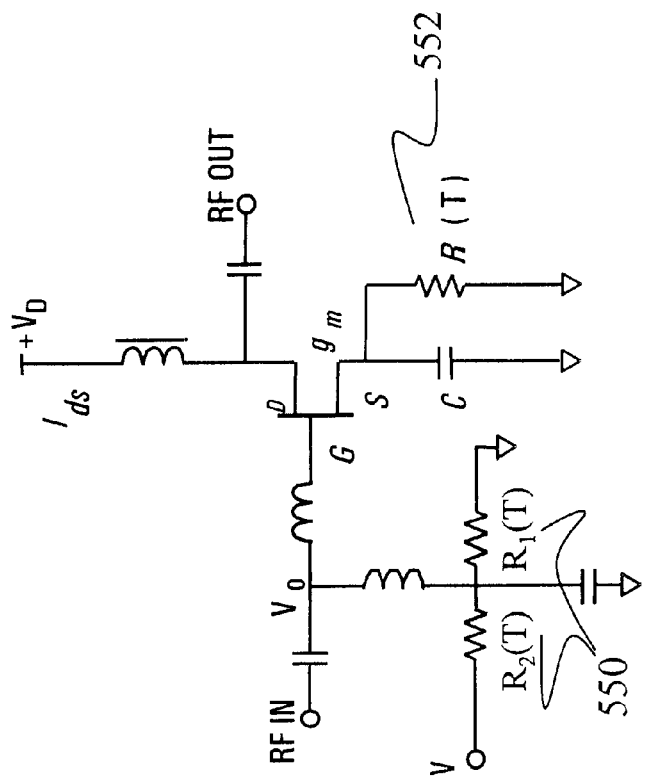
FIG. 5 shows the basic FET amplifier circuit with various biasing schemes.
In FIG. 5a, the FET amplifier circuit is self-biased, whereas in 5b, the FET amplifier circuit is either self-biased or externally adjustable.
Figure 5A:
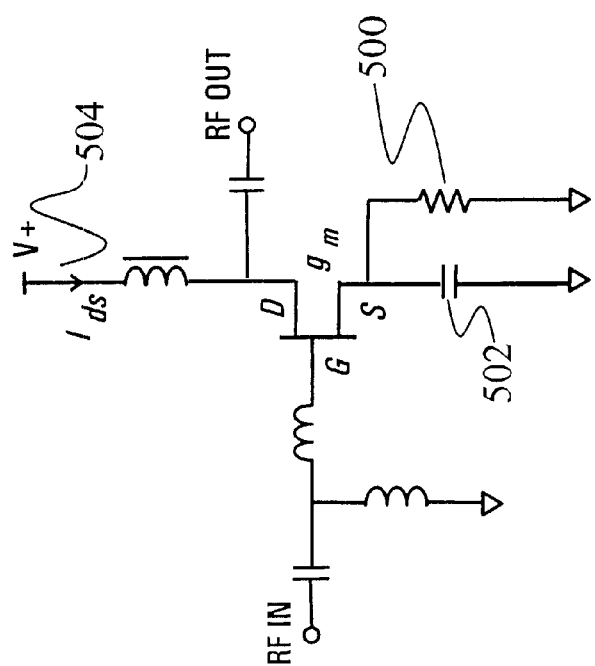

This scheme requires a resistor R(T) 500 that does not change resistance with changes in temperature. Such a resistor 500 is shown in FIG. 5a, as well as a further improvement, whereby the resistor's temperature variation R(T) is designed to reduce the bias drift $\partial I_{ds}/\partial T$ to zero.

Another embodiment of the present invention includes a self-biased HEMT with a zero-temperature-compensated (zero-TC) resistor R(T) 500. The self-biased amplifier circuit of FIG. 5a can be improved through the use of a temperature-compensated resistor R(T) 500, such that $\partial R/\partial T=0$. This resistor 500 is designed with the "zero-TC" length L given by equation 4 above, and the width W to obtain the resistance needed for the desired drain current. The resistor 500 is integrated along with the FET. No external components are required.

Yet another embodiment of the present invention includes a self-biased FET with a temperature-compensating resistor R(T) such that $\partial R/\partial T=0$. A further improvement in the circuit of FIG. 5a is possible by tailoring the temperature variation of the resistor R(T) such that it substantially compensates for the temperature dependence of the FET threshold voltage $V_T$. No external components are needed off-chip, and no additional dc power is required, as compared to a conventional self-bias circuit. From equation (5), $$I_{ds} = \beta(-I_{ds}R - V_T)^2 \quad (10)$$

$$\frac{\partial I_{ds}}{\partial T} = 2\beta(-I_{ds}R - V_T)\left(-\frac{\partial I_{ds}}{\partial T}R - I_{ds}\frac{\partial R}{\partial T} - \frac{\partial V_T}{\partial T}\right) \quad (11)$$

$$= \frac{-g_m\left(I_{ds}\frac{\partial R}{\partial T} + \frac{\partial V_T}{\partial T}\right)}{(1+g_m R)}.$$

To hold constant the drain current $I_{ds}$ such that the change of the drain source current over the change in temperature is zero, i.e. $\partial I_{ds}/\partial T=0$, a resistor R(T) is required with the resistance versus temperature slope:

$$\frac{\partial R}{\partial T} = -\frac{1}{I_{ds}}\frac{\partial V_T}{\partial T}, \quad (12)$$

or alternatively, $$\frac{\partial R}{\partial T} = \frac{R}{V_{gs}}\frac{\partial V_T}{\partial T} \quad \text{or} \quad \frac{\% \Delta R}{\Delta T} = \frac{1}{V_{gs}}\frac{\partial V_T}{\partial T} \times 100\%. \quad (13)$$

Based on the current drain source $I_{ds}$ or voltage gate source $V_{gs}$ of the desired bias point, the resistor-temperature slope is obtained from equation (12) or equation (13), and the length L of the epitaxial resistor R(T) is found from equation (3). Consider the following non-limiting example for building a temperature-compensated self-bias resistor for a 100×0.1 μm² FET with threshold variation a $$\frac{\partial V_T}{\partial T} = -0.4 \text{ mV/° C}..$$

The low-noise bias point is found at $I_{ds}=10$ mA, $V_{gs}=-0.3$V. From equation (13), this requires a resistor with $$\frac{\% \Delta R}{\Delta T} = +0.13 \, \Omega\%/^\circ C\,..$$

Using equation (3) or FIG. 4, this resistance slope occurs in resistors of length L=8.5 μm. For $V_{gs}$=−0.3V at 10 mA, R=30Ω. The solution is an epitaxial resistor with dimensions W=76 μm and L=8.5 μm.

In yet another embodiment, the present invention finds application as an extended FET temperature-compensation system using a reference voltage and several resistors. The invention can achieve even better temperature compensation functions by using more than one resistor, as shown in the circuit of FIG. 5b. Here, a resistive voltage divider 550 is used to scale a reference voltage V by a temperature-variable factor to produce a gate bias voltage $V_o$:

$$V_o = \frac{V}{(R_1+R_2)^2}\left(R_2 \frac{\partial R_1}{\partial T} - R_1 \frac{\partial R_2}{\partial T}\right). \quad (14)$$

For the case $R_1$=$R_2$, the fractional change in Vo versus temperature T is:

$$\% \frac{V_o(T)}{V_o(T_0)} = \frac{1}{2}\left(\frac{\% \Delta R_1}{\Delta T} - \frac{\% \Delta R_2}{\Delta T}\right). \quad (15)$$

The resistive voltage divider 550 may also be used in conjunction with a source resistor $R_S$(T) 552 to generate the bias voltage $V_{gs}$ with a wide range of temperature compensated (TC) slopes. One example is the use of an $R_s$(T) 552 with a positive temperature compensator in conjunction with a gate voltage Vo having a negative temperature compensator, which provides compensation for a FET device with twice the threshold voltage drift as compared to a bias scheme with $R_s$(T) 552 alone. Such a network, with $R_s$(T) designed to drop 2|Vgs| and the resistive voltage divider set for Vo=|$V_{gs}$|, will create a temperature-compensated Vgs bias without the need for a negative bias voltage or external components. Thus, the present invention can be configured to robustly handle even relatively large thermal variations, allowing for temperature invariant performance over a broad range of temperatures.

In another embodiment of the present invention, the resistance of a temperature-compensated resistor is compared with the resistance of an uncompensated resistor. The differences in value are used to sense local temperatures on an integrated circuit. IC chip designers may employ this embodiment to aid in evaluating design functionality, and, perhaps more significantly, the thermal sensing properties of the invention are useful in consumer products for detecting when specific localized temperatures within a circuit traverse a predetermined threshold temperature. When the temperature threshold is crossed, a signal is issued wherein the signal triggers an alarm or a cooling system or, alternatively, operates additional or other devices.

What is claimed is:

1. An apparatus comprising a temperature compensating epitaxial resistor having a first resistive component and a second resistive component, wherein said first resistive component includes gallium and arsenic and includes an electrically isolated semi-conducting channel wherein said channel has:
   a width and a length;
   an electrical resistance functionally dependent on channel geometry; and said second resistive component is comprised of a substantially conducting material and a plurality of ohmic contacts, wherein said ohmic contacts are functionally interfaced with said first resistive component, and wherein said second resistive component has electrical resistance that is functionally dependent on temperature and geometry and wherein said first and second resistive components have opposite, and independently adjustable, functional temperature dependences.

2. The apparatus comprising the temperature compensating epitaxial resistor of claim 1, wherein the epitaxial resistor's electrical performance is functionally dependant on temperature, and wherein said functional dependence may be adjusted by altering the geometry of said first and second resistive components.

3. The apparatus comprising the temperature compensating epitaxial resistor of claim 1, wherein a substantially temperature invariant resistor is achieved by varying the geometry of said first and second resistive components.

4. The apparatus comprising the temperature compensating epitaxial resistor of claim 1, wherein a predefined temperature dependence for the resistor is achieved by varying the geometry of said first and second resistive components.

5. The apparatus comprising a temperature compensating epitaxial resistor of claim 1, wherein the epitaxial resistor is integrated with a field effect transistor, wherein said transistor is subject to:
   a bias current;
   a gate-source bias voltage; and
   wherein said transistor has a threshold voltage; and
   wherein said epitaxial resistor is functionally interfaced with, an active field effect transistor, and said temperature sensitive resistor is included in the bias circuit to control thermally induced parameter variations within the circuit.

6. The field effect transistor according to claim 5, wherein the bias current is kept substantially constant by virtue of said resistor adjusting the gate-source voltage to compensate for a threshold voltage shift.

7. The field effect transistor of claim 5 wherein the functional dependence of transistor parameters on temperature can be controlled by adjusting the geometry of one or both of said resistor's components.

8. The field effect transistor of claim 5 wherein the functional dependence of temperature on performance can be optimized by adjusting the geometry of one or both of the resistive components.

9. The field effect transistor of claim 5 wherein the functional dependence of temperature on performance is substantially eliminated, by adjusting the geometry of one or both of the resistive components.

10. The field effect transistor of claim 5 wherein the resistance of the first resistive component may be optimally tailored for improved thermal compensation by altering the first resistive component's material composition.

11. The field effect transistor of claim 5 wherein the resistance of the second resistive component may be tailored for improved performance by altering the material properties of the second resistive component.

12. A method for controlling or substantially eliminating temperature induced performance variations in field effect transistor circuits utilizing the apparatus comprising a temperature compensating epitaxial resistor of claim 1, wherein said method includes integrating a thermally compensating resistor into said field effect transistor circuits, wherein said resistor compensates for temperature induced performance variations by responding to, and compensating for, temperature induced performance variations.

13. The method for controlling or substantially eliminating the temperature induced performance variations of claim 12 wherein the geometries of one or more of the resistive components are altered to optimize the temperature compensating properties of the epitaxial resistor.

14. The method for controlling or substantially eliminating the temperature induced performance variations of claim 12 wherein the material properties of one or more of the resistive components are altered to optimize the temperature compensating properties of the epitaxial resistor.

15. An apparatus for locally measuring temperature within a circuit, wherein said apparatus comprises two or more reference resistors and two or more temperature indicating resistors, wherein said two or more reference resistors are thermally invariant; and are configured as a bridge; and wherein said two or more temperature indicating resistors have opposite temperature dependences; and wherein one or more of the electrical properties of said two or more temperature indicating resistors and said two or more reference resistors are compared to provide a temperature signal.

16. The temperature measuring apparatus of claim 15, wherein when said temperature signal reaches one or more predetermined levels or ranges of levels, an output signal is generated.

17. The temperature measuring apparatus of claim 15, wherein when the temperature signal provides a telemetry, alarm, or feedback control function.

* * * * *